(12) United States Patent
Ghoshal

(10) Patent No.: US 6,467,951 B1
(45) Date of Patent: Oct. 22, 2002

(54) PROBE APPARATUS AND METHOD FOR MEASURING THERMOELECTRIC PROPERTIES OF MATERIALS

(75) Inventor: Uttam Shyamalindu Ghoshal, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 40 days.

(21) Appl. No.: 09/641,871

(22) Filed: Aug. 18, 2000

(51) Int. Cl.[7] ............ G01N 25/00; G01N 25/20; G01K 7/02
(52) U.S. Cl. ............ 374/45; 374/43; 374/179; 136/227; 324/451
(58) Field of Search ............ 374/179, 180, 374/208, 209, 43, 45, 142; 33/DIG. 21; 136/227, 224; 29/612; 324/451, 72.5

(56) References Cited

U.S. PATENT DOCUMENTS

| | | | | |
|---|---|---|---|---|
| 4,108,163 A | * | 8/1978 | Fleckenstein et al. | 374/208 |
| 5,356,218 A | * | 10/1994 | Hopson et al. | 374/142 |
| 5,617,018 A | * | 4/1997 | Earle | 324/72.5 |
| 5,772,325 A | * | 6/1998 | Hopson et al. | 374/179 |
| 5,887,978 A | * | 3/1999 | Lunghofer et al. | 374/179 |
| 5,969,238 A | * | 10/1999 | Fischer | 374/142 |
| 6,014,027 A | * | 1/2000 | Reichard | 324/72.5 |
| 6,242,903 B1 | * | 6/2001 | Klingberg et al. | 324/72.5 |

* cited by examiner

*Primary Examiner*—Diego Gutierrez
*Assistant Examiner*—Madeline Gonzalez
(74) *Attorney, Agent, or Firm*—Duke W. Yee; Casimer K. Salys; Stephen J. Walder, Jr.

(57) ABSTRACT

A method and apparatus for measuring and characterizing microscopic thermoelectric material samples using scanning microscopes. The method relies on concurrent thermal and electrical measurements using scanning thermal probes, and extends the applicability of scanning thermal microscopes (SThMs) to the characterization of thermoelectric materials. The probe makes use of two thermocouples to measure voltages at the tip and base of a cone tip of the probe. From these voltages, and from a voltage measured across the sample material, the Seebeck coefficient, thermal conductivity and resistance of the sample material can be accurately determined.

29 Claims, 3 Drawing Sheets

PROBE APPARATUS AND METHOD FOR MEASURING THERMOELECTRIC PROPERTIES OF MATERIALS

RELATED APPLICATIONS

The present application is related to commonly assigned and co-pending U.S. patent application Ser. No. 09/641662, entitled "Method and Apparatus for Measuring Thermal and Electrical Properties of Thermoelectric Materials," which is hereby incorporated by reference.

BACKGROUND OF THE INVENTION

1. Technical Field

The present invention is directed to a method and apparatus for measuring thermal and electrical properties of thermoelectric materials.

2. Description of Related Art

One of the major difficulties in developing novel thin film thermoelectric materials lies in obtaining consistent and accurate measurement of their thermal and electrical properties. Traditional methods cannot be easily extended to microscopic characterization because of increased electrical and thermal parasitic losses associated with the probes used to perform the measurements. Additionally, the poor structural stability of some of the novel materials being investigated makes using traditional probe methods unworkable.

For example, in the case of measurements using a probe, such as the "ZT-meter," the time-scales of the transients become short and introduce errors in electrical measurements. Thus it would be beneficial to have an apparatus and method capable of performing measurements of thermal and electrical properties of thermoelectric materials in which the problems of the known methods with regard to thermal parasitic losses and structural stability of the thermoelectric materials, is overcome.

SUMMARY OF THE INVENTION

The present invention provides a method and apparatus for measuring and characterizing microscopic thermoelectric material samples using scanning atomic force microscopes. The methods rely on concurrent thermal and electrical measurements using scanning thermal probes, and extends the applicability of scanning thermal microscopes (SThMs) to the characterization of thermoelectric materials.

The probe of the present invention makes use of two temperature sensors, such as two thermocouples, to measure voltages at the tip and base of a cone tip of the probe. From these voltages, and from a voltage measured across the sample material, the Seebeck coefficient, thermal conductivity and resistance of the sample material can be accurately determined.

These thermoelectric properties may then be used in many different applications. For example, the thermoelectric properties may be used for characterization of scaled silicon devices wherein accurate spatial variation of Seebeck coefficient yields an exact dopant profiling with the silicon devices. Other features and advantages of the present invention will be described in or will become apparent to those of ordinary skill in the art in view of the following description of the preferred embodiment.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

The present invention provides a method and apparatus for measuring and characterizing the thermal and electrical properties of thermoelectric materials. The invention makes use of temperature sensors, such as thermocouple and thermistor probe style temperature sensors, designated for thermal probes and uses a surface electrode at the thermal probe tip for electrical measurements on a sample of the thermoelectric material.

The preferred embodiment of the present invention makes use of two thermocouples as the temperature sensors of the present invention. However, it should be appreciated that the present invention may use other types of temperatures sensors to measure the temperature values at various points on the probe without departing from the spirit and scope of the present invention. For example, rather than two thermocouples, the present invention may use one or more thermistors in place of or in addition to one or more of the thermocouples of the preferred embodiment. For purposes of illustration, however, the present invention will be described in terms of a probe having two therocouples which are used to measure temperature.

PROBE DESIGN

Figure 1:
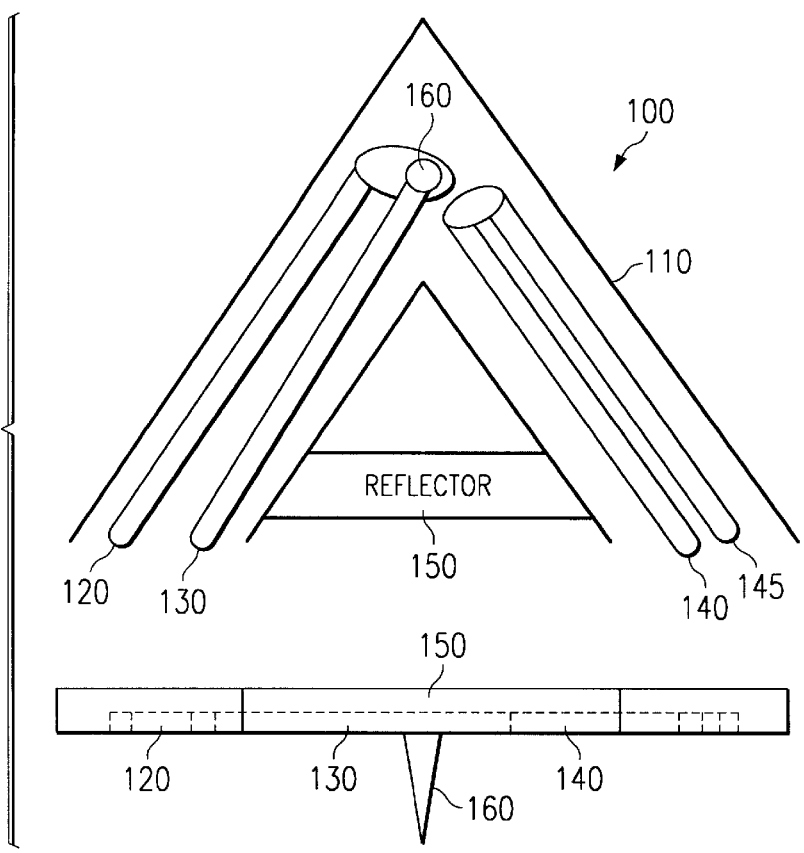
FIG. 1 is an exemplary diagram illustrating a probe in accordance with the present invention.

FIG. 1 is an exemplary diagram illustrating two views of a probe 100 in accordance with the present invention. The probe shown in FIG. 1 is used to measure the thermoelectric properties of thermoelectric materials in a manner described in detail hereafter. The probe in FIG. 1 makes use of two thermocouples to provide measurements of temperature that are then used to calculate thermoelectric properties of the thermoelectric material sample under test.

As shown in FIG. 1, the probe 100 includes a cantilever substrate structure 110, a first lead 120, a second lead 130, a third lead 140, a fourth lead 145, a reflector 150, and a cone 160. The leads 120–145 create two thermocouples which are used, in a manner to be described hereafter, to measure the temperature of the probe tip (cone 160 tip) and the temperature of a sample material. From these measurements, the thermoelectrical properties of the sample material may be determined.

The reflector 150 is used to reflect a laser beam toward a detector (not shown). The laser beam, reflector 150 and detector are used to measure the deflection of the cantilever structure 110 in order to maintain the distance between the probe tip 160 and the sample material at a constant value.

Figure 2:
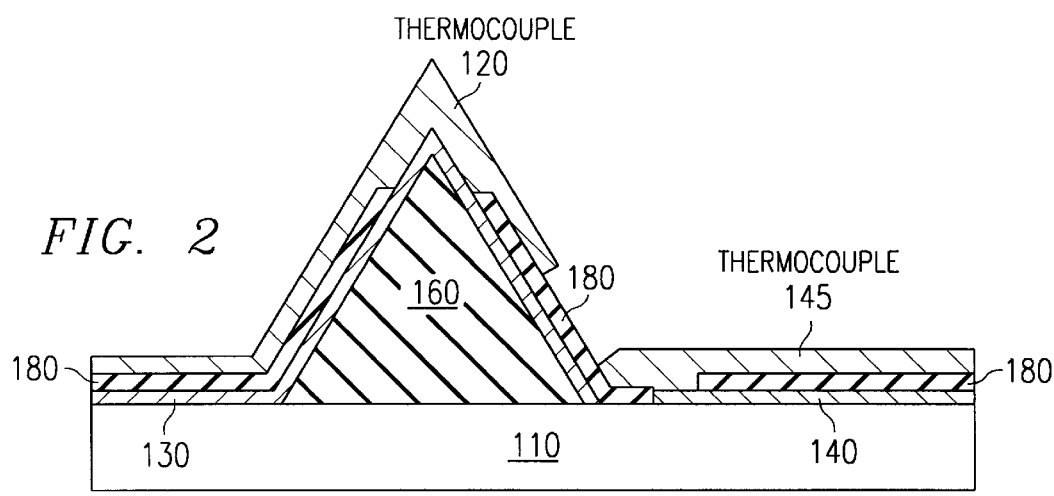
FIG. 2 is an exemplary cross-sectional view of the probe in accordance with the present invention.

FIG. 2 is an exemplary cross section of the probe tip 160. As shown in FIG. 2, the probe tip 160 is comprised of a number of different layers of material. The particular materials described hereafter with reference to the exemplary embodiment are meant to be for illustrative purposes and other materials having similar properties may be used in replacement or in addition to the materials described herein without departing from the spirit and scope of the present invention.

The formation of the probe tip 160 will now be described with reference to FIG. 2. The mechanisms used to create the various layers of the probe, such as deposition and etching, are generally known in the art of semiconductor chip manufacture. However, these mechanisms have not previously been used to create the structure herein described.

The cantilever substrate 110 is created first and is comprised of a silicon or silicon nitride material. A silicon oxide cone 160 is formed on the cantilever substrate 110. A secondary metal layer is then created over the substrate 110 and the cone 160. The secondary metal layer may be, for example, chromium, and is used to create the second lead 130 and third lead 140.

It should be noted that the chromium layer does not cover all of the surface of the substrate 110 and cone 160. Rather, as shown in FIG. 2, a portion of the chromium layer at the base of the cone is etched away so that the two leads 130 and 140 are formed without touching one another.

Once the two leads 130 and 140 are created, a silicon oxide layer 180 is created on top of the chromium layer. The silicon oxide layer 180 is etched at the apex of the cone and at a point at the base of the cone to create two thermocouples which will be used in the present invention to perform thermoelectric property measurements of sample materials.

After the silicon oxide layer 180 is created, the primary metal layer 120 is created. The primary metal layer 120 is comprised of platinum/iridium in an exemplary embodiment, but may be any other type of metal which may be determined to have properties especially well suited for a particular application. As shown in FIG. 2, the primary metal layer 120 is etched away at position near the base of the cone to thereby create the first and fourth leads 120 and 145.

The interaction of the primary and secondary metal layers at the points where the silicon oxide layer 180 was etched away, creates the thermocouples which are used for measurements of thermoelectric properties. Additional layers of material may be added to the structure shown in FIG. 2 so long as these additional layers do not interfere with the operation of the dual thermocouples. For example, fine wires may be added to the cantilever structure 110 for heating the cantilever structure to thereby create a temperature differential, as will be described hereafter.

While the probe structure shown in FIGS. 1 and 2 show a cone-shaped probe tip, the probe tip may be of any shape desirable. For example, the cone-shaped probe tip may be vary narrow or very wide in diameter, may have any value interior angle at the tip, and the like. However, a narrower tip is preferable since the tip localizes measured temperature fields to a smaller area and thus, makes the probe capable of measuring thermoelectric properties of smaller scale materials.

The probe created using the process described above can be used for making measurements in many different applications. The probe may be used to measure thermoelectric properties of nano-scale structures, profiling of silicon dopants of semiconductor materials, characterizing giant magneto-resistive heads, and the like. The present invention is not limited to any one application of the probe and is intended to cover all possible applications to which the probe may be made.

Those of ordinary skill in the art will appreciate that the probe of the present invention is utilized along with a computing system in which the calibration and computations described hereafter are performed. The probe is used to provide measured quantities which are then processed by the computing system to calibrate the probe and generate values for the thermoelectric properties of the materials under test.

Calibration of the Probe

Before the probe can be used to measure the thermoelectric properties of sample materials, the probe must be calibrated. The calibration is performed using a sample whose thermoelectric properties are generally known in order to obtain a relationship of thermoelectric properties. The calibration method generally includes the steps of:

1) measuring the voltages across each of the thermocouples;
2) measuring the temperature from a bottom lead to the back side of the sample;
3) calibrating temperature according to NIST standards based on the above measurements; and
4) calibrating heat flow using the known thermoelectrical properties of the sample.

Figure 3:
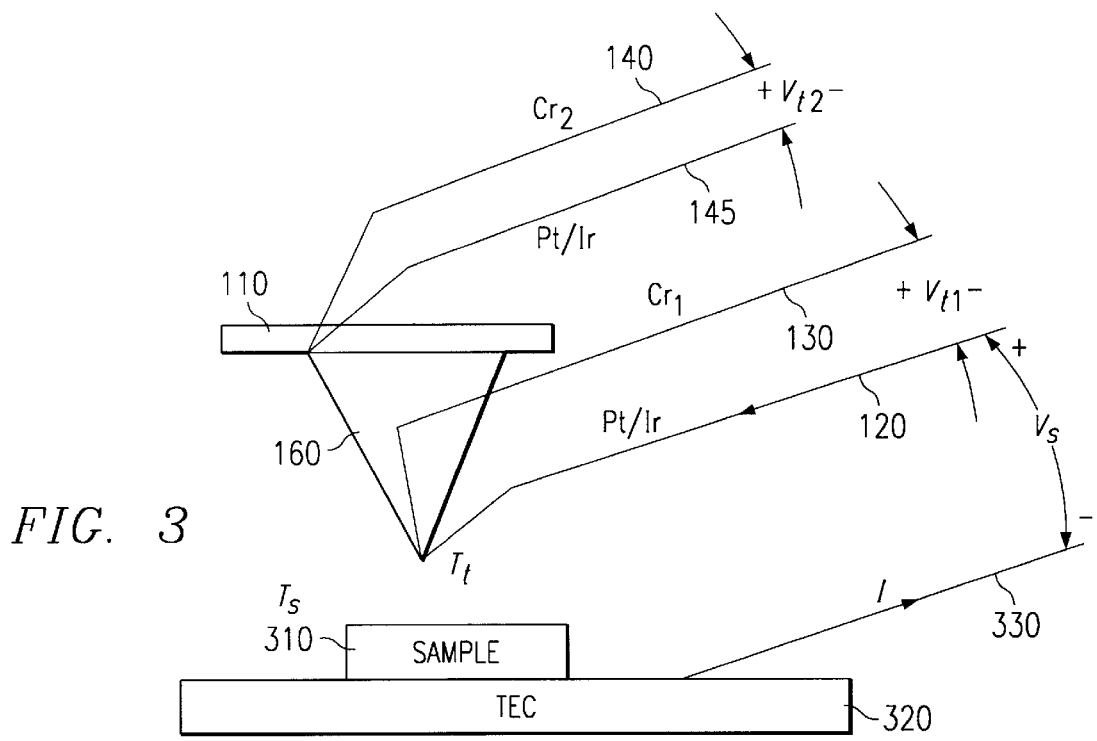
FIG. 3 is an exemplary circuit diagram illustrating the thermocouples of the probe.

FIG. 3 shows a circuit schematic for a mixed mode operation probe in accordance with the present invention. As shown in FIG. 3, the probe 100 consists of a first lead 120, a second lead 130, and a third lead 140. The voltage $V_{t1}$ across the first and second leads 120 and 130, connected to the thermocouple at the tip 160, are used to monitor the temperature and the heat flow out of the tip of the cone of the probe. The voltage $V_{t2}$ across the third and fourth leads 140 and 145, connected to the thermocouple at the base, are used to monitor the temperature and the heat flow at the base of the cone of the probe. Based on these voltages, the difference in temperature $\Delta T_r$ between the tip and base of the cone can be calculated. Current-voltage (I-Vs) measurements at the first and fifth leads 120 and 330 characterize the electrical properties of the thermoelectric material sample 310.

Figure 6:
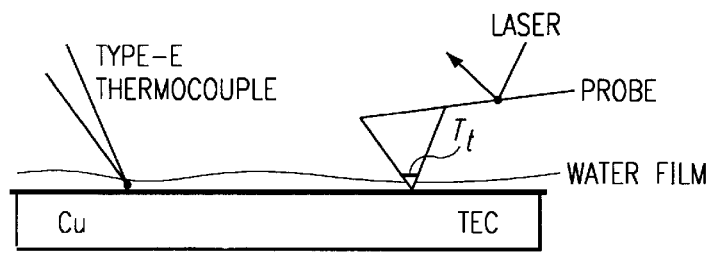
FIGS. 5 and 6 are diagrams illustrating two methods of performing the calibration in accordance with the present invention.
Figure 5:
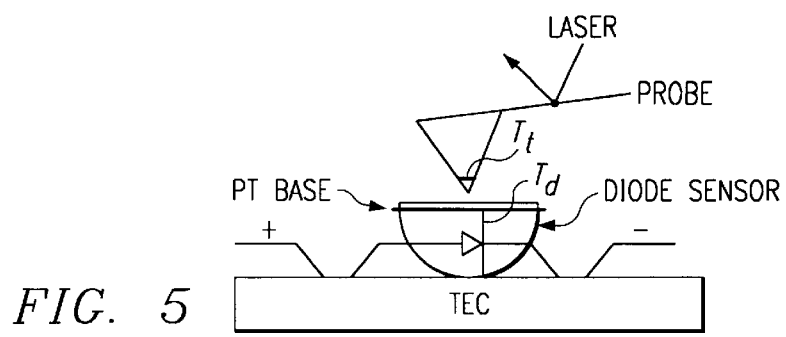

The temperature sensors, i.e. thermocouples, at the tip may be calibrated in a number of different ways. In particular, the preferred embodiment of the present invention calibrates the temperature sensors at the tip by scanning the probe tip over a base of a pre-calibrated surface and over a metal surface of a thermoelectric cooler 320 concurrently. For example, the pre-calibrated material may be a platinum base of a pre-calibrated silicon diode mounted on the thermoelectric cooler and the metal surface may be a copper metal surface of the thermoelectric cooler 320, as shown in FIG. 5. In separate calibration, scanning a metal surface of a thermoelectric cooler may be concurrently monitored by a pre-calibrated E-type thermocouple, for example, as shown in FIG. 6. Regardless of the particular manner by which calibration is performed, the method of temperature calibration is essentially the same.

The temperature sensors, i.e. thermocouples, at the tip and base of the cone 160 are used to measure voltage values for various tip and sample temperatures. With the present invention, a laser, which may be used to detect cantilever deflection of the probe 100, is switched OFF and the thermoelectric cooler 320 is activated to increase and decrease the temperature of the sample near the ambient.

Figure 7:
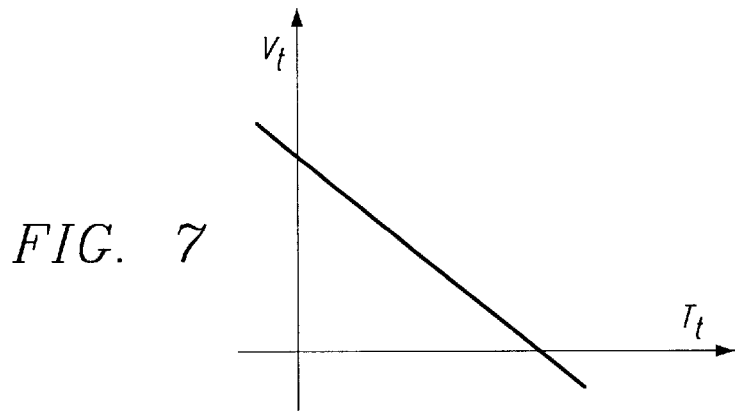
FIG. 7 is an exemplary graph of voltage versus temperature at the tip of the probe, the relationship having been obtained from temperature calibration of the probe.

Measurements of the voltages $V_{t1}$ and $V_{t2}$ are made using the thermocouples and are used to plot a relationship between the voltages and the temperature of the precalibrated surface. Using National Institute of Standards and Technology (NIST) temperature standards, a relationship of voltage to temperature is identified using known points. FIG. 7 shows an exemplary relationship between the tip voltage and the tip temperature. In this way, a one-to-one relation table between the thermocouple sensor voltage V and the temperature T may be obtained.

Although the above method is used in the preferred embodiment of the present invention, other methods of performing temperature calibration may be used with the present invention without departing from the spirit and scope of the present invention.

Once temperature calibration is performed, the thermocouple sensors must be calibrated for measurement of heat flow. The heat flow calibration makes use of a material having known thermoelectric properties. In particular, materials having known Seebeck coefficient $\alpha x$ and thermal conductivity $\lambda_k$, are utilized.

Figure 4:
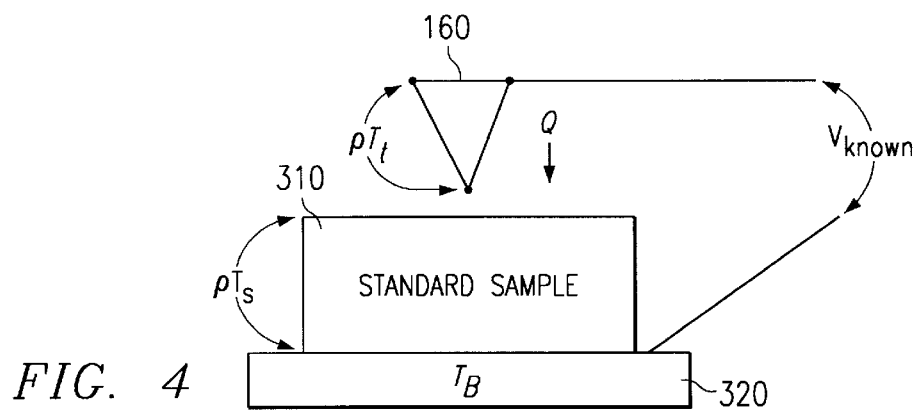
FIG. 4 is an exemplary diagram illustrating the quantities used to perform temperature and heat flow calibration in accordance with the present invention.

FIG. 4 is an exemplary diagram that illustrates the basic method of heat calibration in accordance with the present invention. The heat flow Q from the tip to the sample surface is calibrated by scanning the probe tip in a contact-mode of operation over thermoelectric materials, such as $Bi_{0.5}Sb_{1.5}Te_3$, $Bi_2Te_{2.9}Se_{0.1}$, ZnSb, and Bi crystals, whose Seebeck coefficient $\alpha_{known}$ and thermal conductivity $\lambda_{known}$ are known. The heat flow balance results in the following equation:

$$Q_p(\Delta T_t) = G\lambda_k \Delta T_s \quad (1)$$

where $\Delta T_s$ is the temperature drop across the sample and G is a geometric parameter. $G \approx 2\pi\alpha$ where $\alpha$ is the "thermal" radius of the probe tip. The value for $\Delta T_s$ equals the ratio of the voltage across the thermocouple between leads 120 and 140 and the Seebeck coefficient of the material (V/$\alpha$). The open circuit voltage $V_{known}$ is measured across leads 120 and 330. Thus, the equation becomes:

$$\frac{Q_p(\Delta T_t)}{G} = \lambda_{known}(V_{known}/\alpha_{known}) \quad (2)$$

Figure 8:
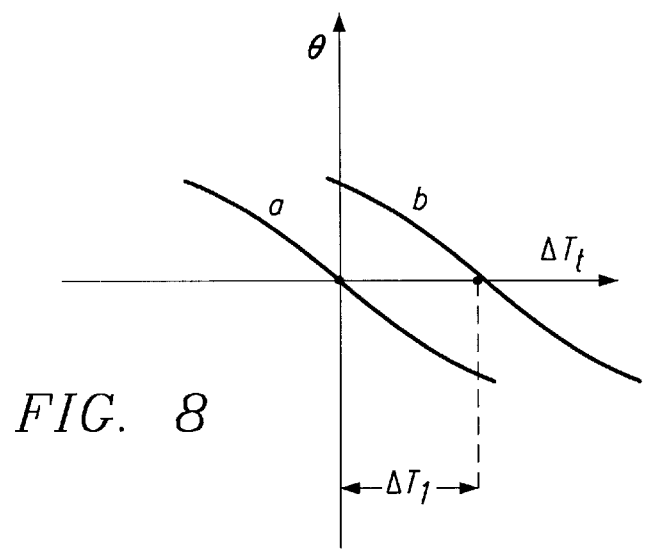
FIG. 8 is an exemplary graph of $\Theta$ versus temperature differential, the relationship having been obtained from heat flow calibration of the probe tip.
Figure 9:
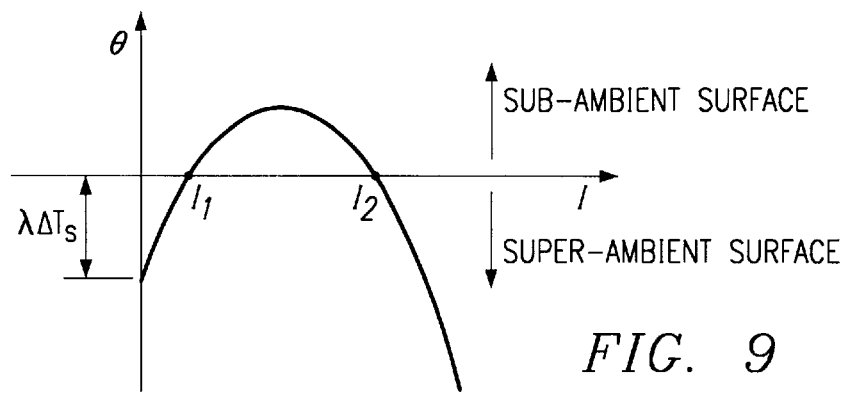
FIG. 9 is an exemplary graph of $\Theta$ versus current for a material under test.

As shown in FIG. 8, the quantity ($Q_p/G$), denoted by $\Theta$, which is sometimes referred to as the normalized heat flow, can be tabulated for standard conditions, e.g., when the laser used for monitoring deflection is turned OFF (curve a) and turned ON (curve b). $\Theta=0$ at $T_t=0$ when the laser is OFF, and at $T_t=\Delta T_1$ when the laser is ON. Thus, from the temperature and heat flow calibrations above, the relationships $V_t/T_t$ and $\Theta/\Delta T_t$ provide a complete thermoelectric calibration and characterization of the probe tip.

Thermoelectric Characterization of Materials

After calibration, the present invention may be used to thermally characterize thermoelectric materials. The method and apparatus of the present invention exploit the open-circuit condition: I=0. With the method and apparatus of the present invention, the tip voltage $V_t$ and open-circuit voltage $V_{so}$ are concurrently measured over the thermoelectric sample of unknown thermal conductivity $\lambda$ and Seebeck coefficient a with a calibrated probe tip. $T_b$, the backside temperature of the sample, is varied by cooling the backside of the sample above and below the ambient. Alternatively, if there are heater wires provided in the cantilever structure 110, the tip may be heated by passing high current through the heater wires. Any method of creating a temperature difference across the sample may be used without departing from the spirit and scope of the present invention. In doing so, the following relationship is obtained:

$$\lambda \Delta T_s = \frac{\lambda V_s}{a} = \Theta(\Delta T_t) \quad (3)$$

where $\lambda$ is an unknown thermal conductivity of the material and a is an unknown Seebeck coefficient of the material.

The ratio of the thermal conductivity of the material to its Seebeck coefficient can be measured precisely from equation (3), independent of the interface properties between the probe tip and the sample:

$$\frac{\lambda}{a} = \frac{\Theta(\Delta T_t)}{V_s} \quad (4)$$

If either the thermal conductivity or the Seebeck coefficient is known, the other parameter can be accurately determined using the relationship above. This is especially useful, for example, when performing dopant profiling of silicon wafer chips. Since the thermal conductivity of silicon is a known value, measurements of the Seebeck coefficient by scanning the probe of the present invention across the chip, can be used to obtain an accurate profile of the dopants in the chip structure. In addition, these values can also be used to calculate the cooling capacity of thermoelectric coolers.

Electrical Characterization of Materials

The electrical characterization exploits the thermal isolation condition: $Q_p=0$ or $\Theta=0$. Under this condition, there is no temperature drop across the interface between the tip and the thermal sensor. The tip thermal sensor measures the temperature of the sample. An electric current is passed through the tip to attain this condition.

In the above example, the backside of the sample is maintained at temperature greater than the ambient temperature ($T_b>T_a$) so that $\lambda\Delta T_s<0$ at I=0. The electric current I produces cooling at the contacts and results in the condition $\Theta=0$ and $T_t=T_s$ at I=$I_1$. If the current is increased further, the cooling effect increases and $\Theta$ attains a maximum when the surface temperature is such that the Joule heating balances the thermoelectric cooling effects. Further increase in I results in lower $\Theta$ and another $\Theta=0$ condition at I=$I_2$. The thermoelectric voltage ($\alpha\Delta T_s$) is the same at I=$I_1$ and I=$I_2$:

$$R + R_c = \frac{(V_{s2} - V_{s1})}{(I_2 - I_1)} \text{ and} \quad (5)$$

$$a = \frac{(I_2 V_{s1} - I_1 V_{s2})}{(I_2 - I_1)(T_b - T_t)} \quad (6)$$

where R is the resistance of the sample material and $R_c$ is the electrical contact resistance of the contact between the probe and the sample material.

Alternatively (especially if the magnitude of the current I needs to be limited to small values for ultrathin films of the order of 100 nms), the $\Theta=0$ can be obtained for two different values of $T_b$ by changing the current of the external thermoelectric cooler. If the corresponding values of I are $I_{01}$ and $I_{02}$, the I-V relations for the two cases are:

$$V_{s1} = I_{01}(R+R_c) + \alpha(T_t - T_b)$$

$$V_{s2} = I_{02}(R+R_c) + \alpha(T_t - T_{b2}) \quad (7)$$

Solving the simultaneous equations results in:

$$R + R_c = \frac{[(T_t - T_{b1})V_{s2} - (T_t - T_{b2})V_{s1}]}{[(T_t - T_{b1})I_{o2} - (T_t - T_{b2})I_{o1}]} \text{ and} \quad (8)$$

$$a = \frac{(I_{o2}V_{s1} - I_{o1}V_{s2})}{[(T_t - T_{b1})I_{o2} - (T_t - T_{b2})I_{o1}]} \quad (9)$$

Once the Seebeck coefficient $\alpha$ is known, the thermal conductivity $\lambda$ can be calculated using the equation (4). Moreover, the Seebeck coefficient and the resistivity of the sample material can be calculated using the above relationships and the following relationships relating to thermal conductance. With these thermoelectric properties of the sample material, the cooling performance of the sample material can be accurately determined.

Thermal Conductance

Although the thermal conductivity $\lambda$ can be calculated independent of the thermal conductance of the element, it is important to extract the thermal conductance of the thermoelectric element for estimating the contact resistances. In order to extract the thermal conductance, let the temperature differential across the sample material be $\Delta T_s$ and the corresponding open-circuit voltage be $V_{so}=\alpha\Delta T_s$. One method to obtain the thermal conductance is to measure the differential change in electrical and thermal characteristics when the sample material is perturbed with a small current i about I=0. The heat balance conditions at the tip-sample surface for small positive-and negative-currents of magnitude i will be:

Cooling Mode:

$$Q(T_t+\delta T_t)=\alpha i(T_b+\Delta T_s-\delta T_s)-xi^2R-i^2R_c+K(\Delta T_s-\delta T_s) \quad (10)$$

Heating Mode:

$$Q(T_t+\delta T_t)=-\alpha i(T_b+\Delta T_s+\delta T_s)-xi^2R-i^2R_c+K(\Delta T_s+\delta T_s) \quad (11)$$

where $\delta T_t$ and $\delta T_s$ are the perturbations in tip temperature and sample surface temperature and x denotes the fraction of Joule heat generated in the thermoelement that flows back to the tip.

If $Q(T_t+\delta T_t)-Q(T_t-\delta T_t)=2\delta Q$, the following relation can be obtained based on equations (10) and (11):

$$\delta T_s = \frac{ai(T_b + \Delta T_s) - \delta Q}{K} \quad (12)$$

The voltages across the thermoelement for positive and negative values of current are:

$$V_s+\delta V=i(R+R_c)+\alpha(\Delta T_s-\delta T_s)$$

$$V_s-\delta V=i(R+R_c)+\alpha(\Delta T_s+\delta T_s) \quad (13)$$

Hence, the differential voltage about the zero-current bias point can be given by:

$$\Delta T_s=i(R+R_c)-\alpha T_s \quad (14)$$

Substituting the value of $\delta T_s$ from equation (12) and noting that $\delta Q/K=\delta\Theta/\lambda$ results in a thermal resistance:

$$K = \frac{a^2 i(T_b + \Delta T_s)}{\left[i(R + R_c) - \delta V - \left(\frac{a}{\lambda}\right)\delta\Theta\right]} \quad (15)$$

Note that the relation is valid even for the particular case of $\Delta T_s=0$ and $T_b=T_a$. The conductance can thus be accurately estimated by measuring the amplitude of the variations of $\delta V$ and $\delta\Theta$ for a sinusoidal/bipolar step variation of I.

Estimation of Contact Impedances

In the thermal characterization dealing with the open-circuit condition I=0, the heat flow through the tip to the sample surface is equal to the heat flow into the sample. This condition can be used to estimate the contact thermal resistance $K_c$.

$$Q=K_c(T_t-T_s)=K(T_s-T_b) \quad (16)$$

or, $$K_c = K\left(\frac{\Delta T_s}{T_t - T_b - \Delta T_s}\right) = K\left(\frac{V_{so}/a}{T_t - T_b - V_{so}/a}\right)$$

Hence, $$K_c = K\left[\frac{V_{so}}{a(T_t - T_b) - V_{so}}\right] \quad (17)$$

The electrical contact resistance $R_c$ can be estimated by modeling the properties of the interface between the cone tip and the sample material. If it is assumed that the contact resistances are primarily electronic in nature and are related by a boundary form of the Wiedmann-Franzlaw, the following relation is obtain:

$$R_c = \frac{L_0 T_s}{K_c} \quad (18)$$

where $L_0 \sim (156\mu V/K)^2$ is the Lorentz number. Equations (5) and (8) can yield a value for the intrinsic thermoelement resistance if the contact resistance $R_c$ is known.

It is important to note that while the present invention has been described in the context of a probe apparatus coupled to a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A probe for measuring thermoelectric properties of a material, comprising:
   a probe body;
   a probe tip formed on the probe body;
   a first temperature sensor positioned at a tip of the probe tip;
   a second temperature sensor positioned at a base of the probe tip; and
   a voltage sensor for measuring a voltage across the material wherein temperatures measured at the first temperature sensor and the second temperature sensor are used with the voltage measured across the material to determine the thermoelectric properties of the material.

2. The probe of claim 1, wherein the first temperature sensor is a first thermocouple that comprises a first lead and a second lead, and wherein the second temperature sensor is a second thermocouple that comprises a third lead and a fourth lead.

3. The probe of claim 2, wherein the first lead and the third lead are comprised of a platinum/iridium metal composition and the second lead and fourth lead are comprised of chromium.

4. The probe of claim 2, wherein the voltage sensor includes a fifth lead to a back side of the material, the fifth lead and the first lead being used to measure the voltage across the material.

5. The probe of claim 2, wherein the second thermocouple comprises:
   a first layer of metal formed over the probe body and the probe tip;
   a silicon oxide layer formed over the first layer of metal and etched at an apex of the probe tip; and
   a second layer of metal formed over the silicon oxide layer.

6. The probe of claim 5, wherein the first layer of metal is comprised of chromium and the second layer of metal is comprised of a platinum/iridium metal composition.

7. The probe of claim 1, further comprising a reflector for reflecting a laser beam to thereby determine a relative position of the probe to the material.

8. The probe of claim 7, wherein the probe body is a cantilever probe body and wherein the reflector is used to determine a deflection of the cantilever probe body.

9. The probe of claim 1, wherein the probe tip is a cone shaped probe tip.

10. The probe of claim 1, wherein the probe body is formed of one of a silicon and a silicon nitride material.

11. The probe of claim 1, wherein the probe tip comprises a silicon oxide cone.

12. The probe of claim 1, further comprising a heater wire on the probe body.

13. The probe of claim 1, wherein at least one of the first temperature sensor and the second temperature sensor is a thermistor.

14. A probe for measuring thermoelectric properties of a material, comprising:
   a probe body;
   a probe tip formed on the probe body;
   a first temperature sensor positioned at a tip of the probe tip; and
   a second temperature sensor positioned at a base of the probe tip, wherein temperatures measured at the first temperature sensor and the second temperature sensor are used to determine the thermoelectric properties of the material, wherein the first temperature sensor is a first thermocouple that comprises a first lead and a second lead, wherein the second temperature sensor is a second thermocouple that comprises a third lead and a fourth lead, and wherein the first thermocouple comprises:
   a first layer of metal formed over the probe body and the probe tip and etched at a base of the probe tip;
   a silicon oxide layer formed over the first layer of metal; and
   a second layer of metal formed over the silicon oxide layer and etched at the base of the probe tip.

15. The probe of claim 14, wherein the first layer of metal is comprised of chromium and the second layer is comprised of a platinum/iridium metal composition.

16. A method of forming a probe for measuring thermoelectric properties of a material, comprising:
   forming a probe body;
   forming a probe tip formed on the probe body;
   forming a first temperature sensor positioned at a tip of the probe tip;
   forming a second temperature sensor positioned at a base of the probe tip; and
   forming a voltage sensor for measuring a voltage across the material, wherein voltages measured at the first thermocouple and the second thermocouple are used with the voltage measured across the material to determine the thermoelectric properties of the material.

17. The method of claim 16, wherein forming the first temperature sensor comprises forming a first thermocouple having a first lead and a second lead, and wherein forming the second temperature sensor comprises forming a second thermocouple having a third lead and a fourth lead.

18. The method of claim 17, wherein the first lead and the third lead are comprised of a platinum/iridium metal composition and the second lead and fourth lead are comprised of chromium.

19. The method of claim 17, wherein forming the voltage sensor includes forming a fifth lead to a back side of the material, the fifth lead and the first lead being used to measure the voltage across the material.

20. The method of claim 17, wherein forming the first thermocouple and forming the second thermocouple comprises:
   forming a first layer of metal over the probe body and the probe tip;
   etching a portion of the first layer of metal at a base of the probe tip;
   forming a silicon oxide layer over the first layer of metal;
   etching the silicon oxide layer at an apex of the probe tip;
   forming a second layer of metal over the silicon oxide layer; and
   etching a portion of the second layer of metal at the base of the probe tip.

21. The method of claim 20, wherein the first layer of metal is comprised of chromium.

22. The method of claim 20, wherein the second layer of metal is comprised of a platinum/iridium metal composition.

23. The method of claim 16, further comprising forming a reflector for reflecting a laser beam to thereby determine a relative position of the probe to the material.

24. The probe of claim 23, wherein the probe body is formed as a cantilever probe body and wherein the reflector is used to determine a deflection of the cantilever probe body.

25. The method of claim 16, wherein the probe tip is formed as a cone shaped probe tip.

26. The method of claim 16, wherein the probe body is formed of one of a silicon and a silicon nitride material.

27. The method of claim 16, wherein the probe tip is formed of a silicon oxide material.

28. The method of claim 16, further comprising forming a heater wire on the probe body.

29. The method of claim 16, wherein at least one of the first temperature sensor and the second temperature sensor is a thermistor.

* * * * *